(12) United States Patent
Nomura et al.

(10) Patent No.: US 11,774,808 B2
(45) Date of Patent: Oct. 3, 2023

(54) DISPLAY DEVICE

(71) Applicant: Japan Display Inc., Tokyo (JP)

(72) Inventors: Morikazu Nomura, Tokyo (JP); Yoshitaka Ozeki, Tokyo (JP); Toru Kawamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/161,351

(22) Filed: Jan. 30, 2023

(65) Prior Publication Data

US 2023/0168545 A1    Jun. 1, 2023

Related U.S. Application Data

(63) Continuation of application No. 17/562,341, filed on Dec. 27, 2021, now Pat. No. 11,598,993, which is a (Continued)

(30) Foreign Application Priority Data

Dec. 26, 2017 (JP) ................................ 2017-249823

(51) Int. Cl.
*G02F 1/1339* (2006.01)
*G02F 1/1362* (2006.01)
(Continued)

(52) U.S. Cl.
CPC ........ *G02F 1/13394* (2013.01); *G02F 1/1368* (2013.01); *G02F 1/133512* (2013.01); (Continued)

(58) Field of Classification Search
CPC ............. G02F 1/1333; G02F 1/133345; G02F 1/133357; G02F 1/133512; G02F 1/133514; G02F 1/1339; G02F 1/13394; G02F 1/13396; G02F 1/1343; G02F 1/134309; G02F 1/13439; G02F 1/134372; G02F 1/1362; G02F 1/136227; G02F 1/136286; G02F 1/1368; G02F 2201/52; H01L 27/124; H01L 27/1248
See application file for complete search history.

(56) References Cited

U.S. PATENT DOCUMENTS 9,638,961 B2   5/2017 Nomura
2016/0202570 A1   7/2016 Liu et al.
(Continued)

FOREIGN PATENT DOCUMENTS

JP   2013186148 A   9/2013
JP   2016001350 A   1/2016
(Continued)

*Primary Examiner* — Thoi V Duong
(74) *Attorney, Agent, or Firm* — Maier & Maier, PLLC

(57) ABSTRACT

According to one embodiment, a display device includes a first substrate including a first signal line and a second signal line adjacent to each other along a first direction, an organic insulating film located on the first signal line and the second signal line, and a first spacer located on the organic insulating film and a second substrate opposing the first substrate and including a second spacer opposing the first spacer. The organic insulating film has a through-hole between the first signal line and the second signal line in plan view. The first spacer is provided to overlap the through-hole in plan view and filling the through-hole.

7 Claims, 19 Drawing Sheets

Related U.S. Application Data continuation of application No. 17/003,326, filed on Aug. 26, 2020, now Pat. No. 11,269,222, which is a continuation of application No. 16/232,218, filed on Dec. 26, 2018, now Pat. No. 10,795,214.

(51) Int. Cl.
*G02F 1/1343* (2006.01)
*G02F 1/1333* (2006.01)
*H01L 27/12* (2006.01)
*G02F 1/1368* (2006.01)
*G02F 1/1335* (2006.01)

(52) U.S. Cl.
CPC .. *G02F 1/136227* (2013.01); *G02F 1/136286* (2013.01); *H01L 27/124* (2013.01); *H01L 27/1248* (2013.01); *G02F 1/13396* (2021.01); *G02F 1/13439* (2013.01); *G02F 1/133357* (2021.01); *G02F 1/133514* (2013.01); *G02F 1/134309* (2013.01); *G02F 1/134372* (2021.01); *G02F 2201/52* (2013.01)

(56) References Cited

U.S. PATENT DOCUMENTS

2016/0274403 A1 9/2016 Araki et al.
2017/0038637 A1 2/2017 Takeda et al.

FOREIGN PATENT DOCUMENTS

JP 2017032812 A 2/2017
JP 2017102491 A 6/2017

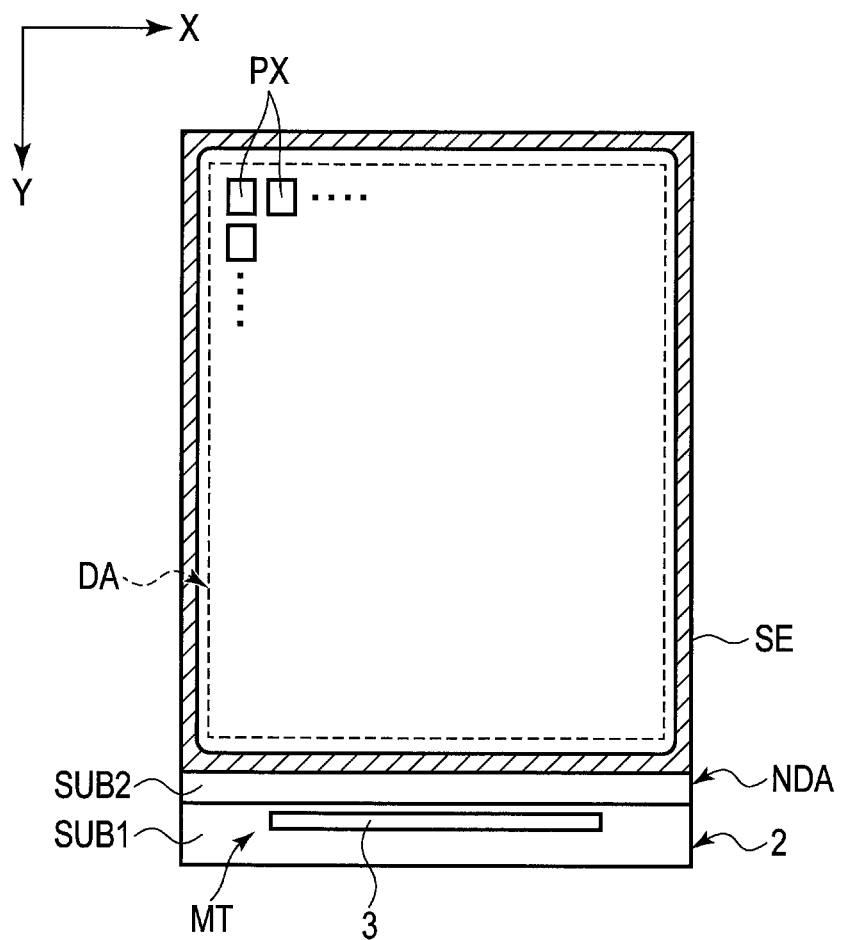
F I G. 1

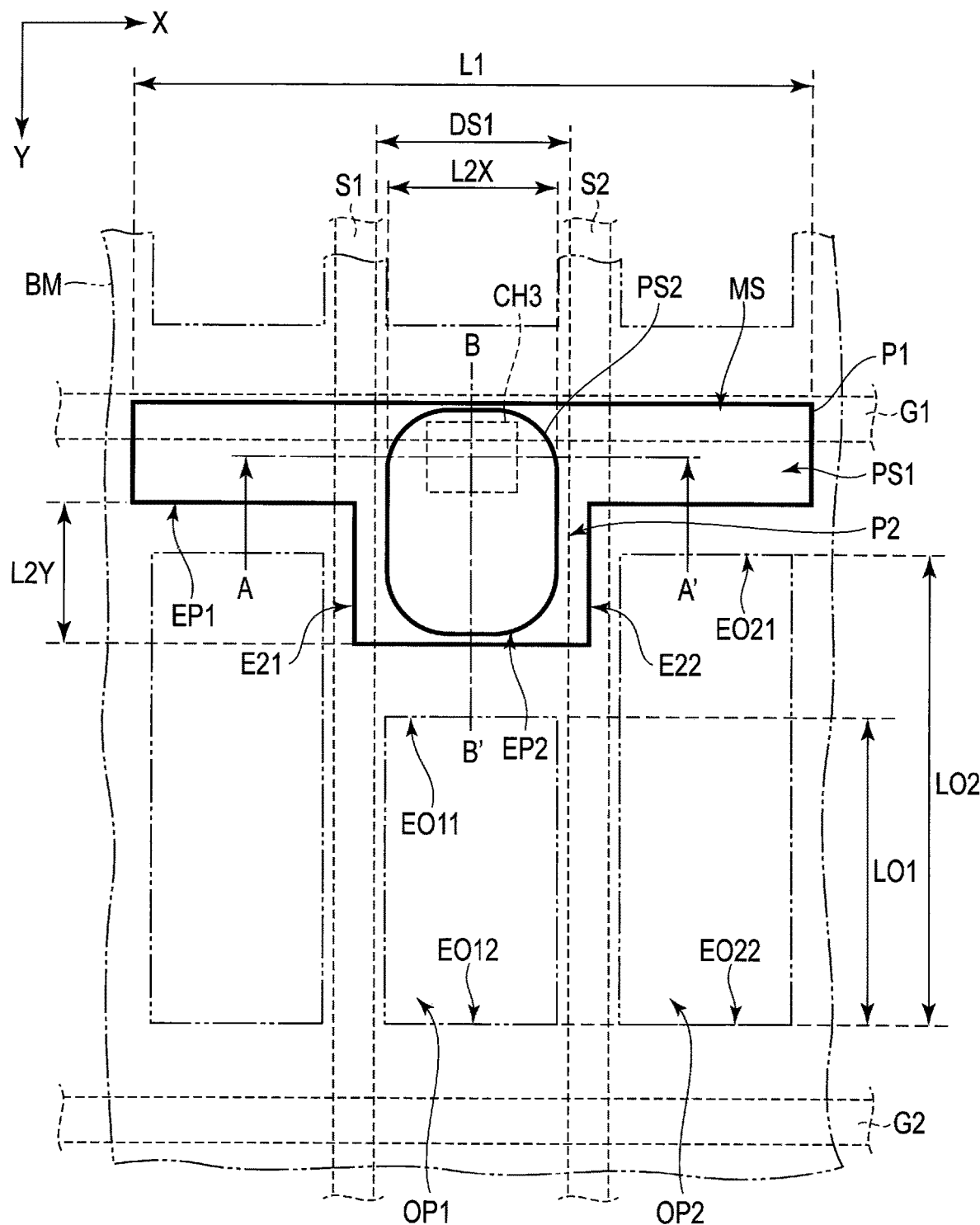
F I G. 3

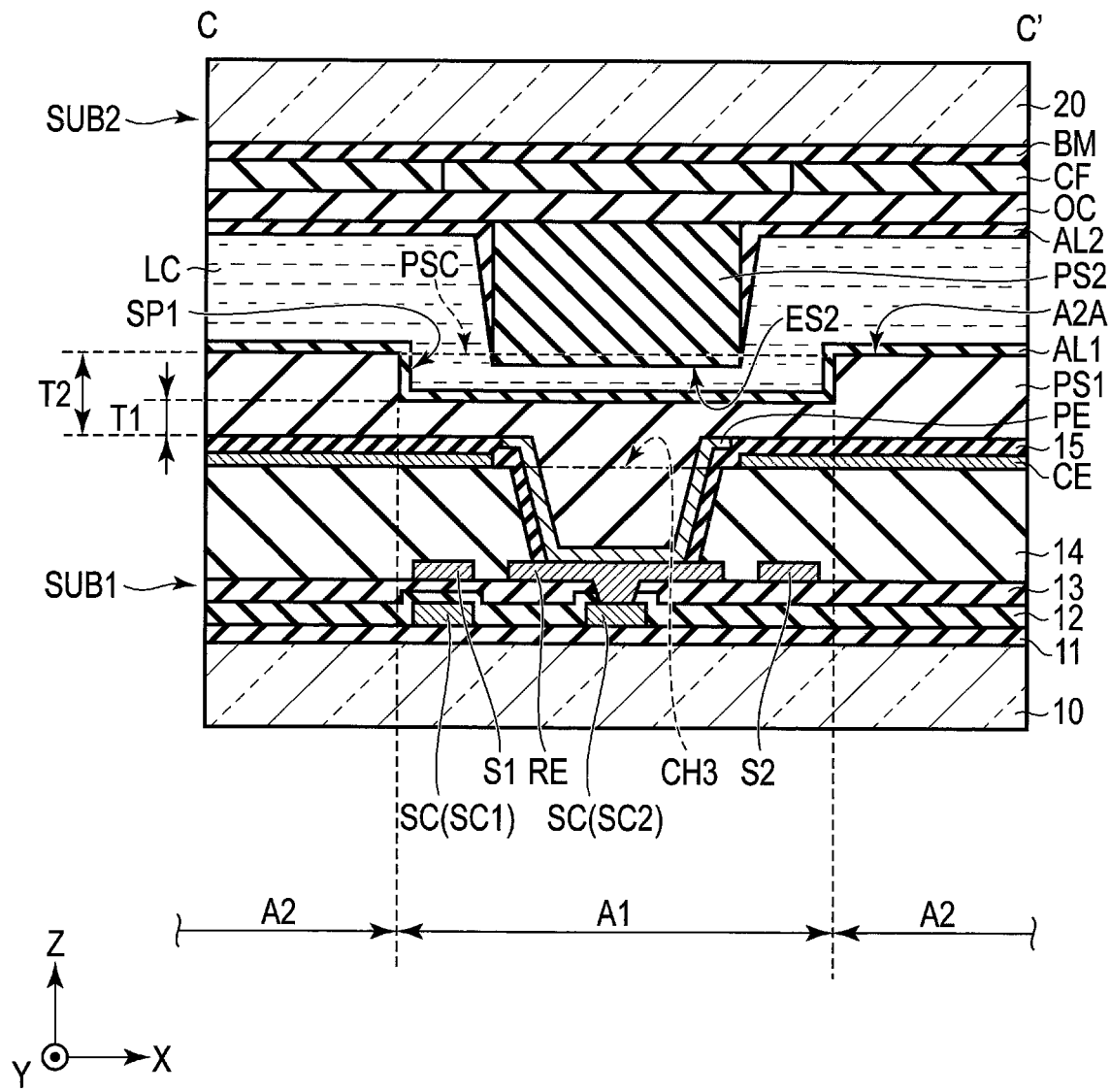
F I G. 7

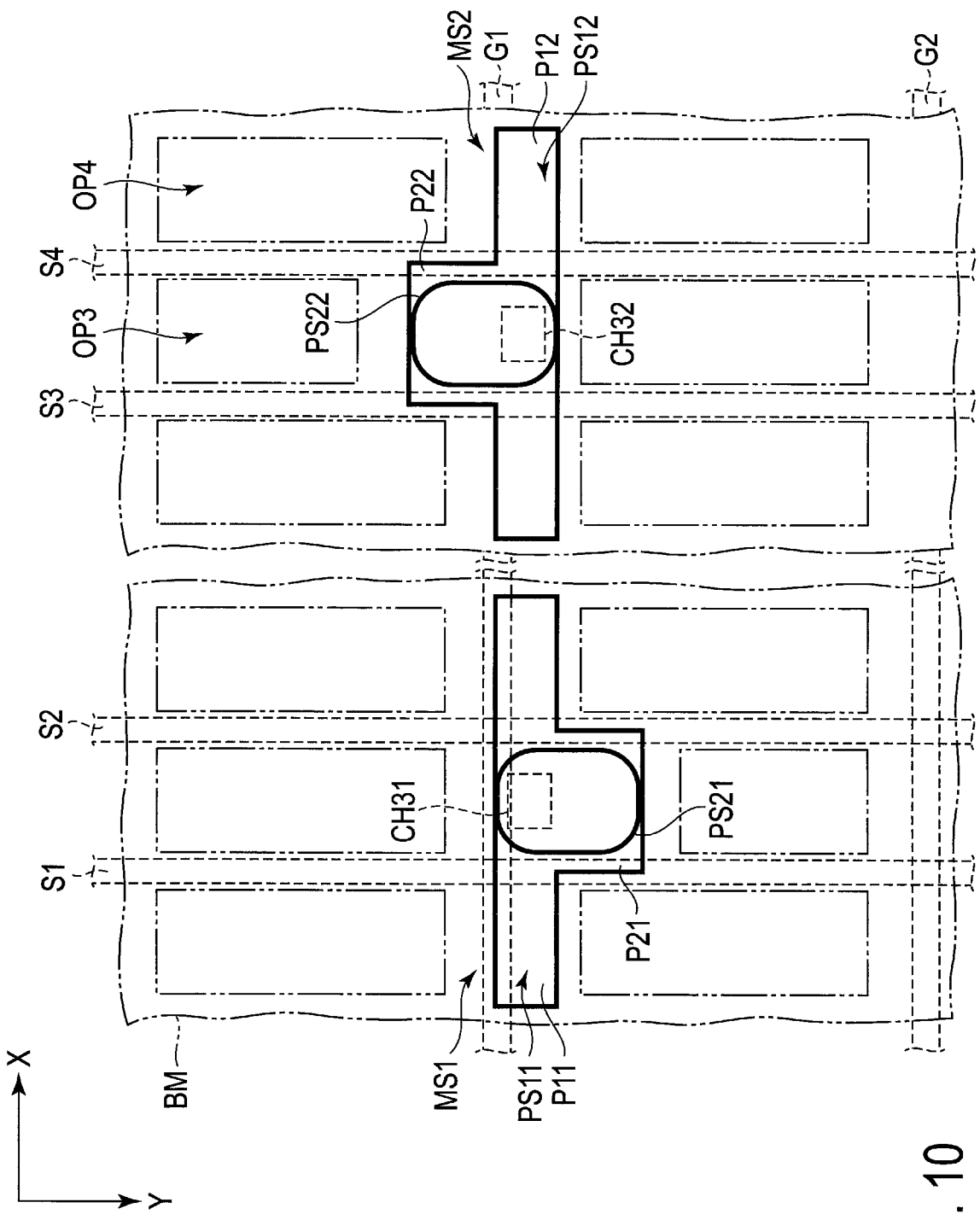
F I G. 10

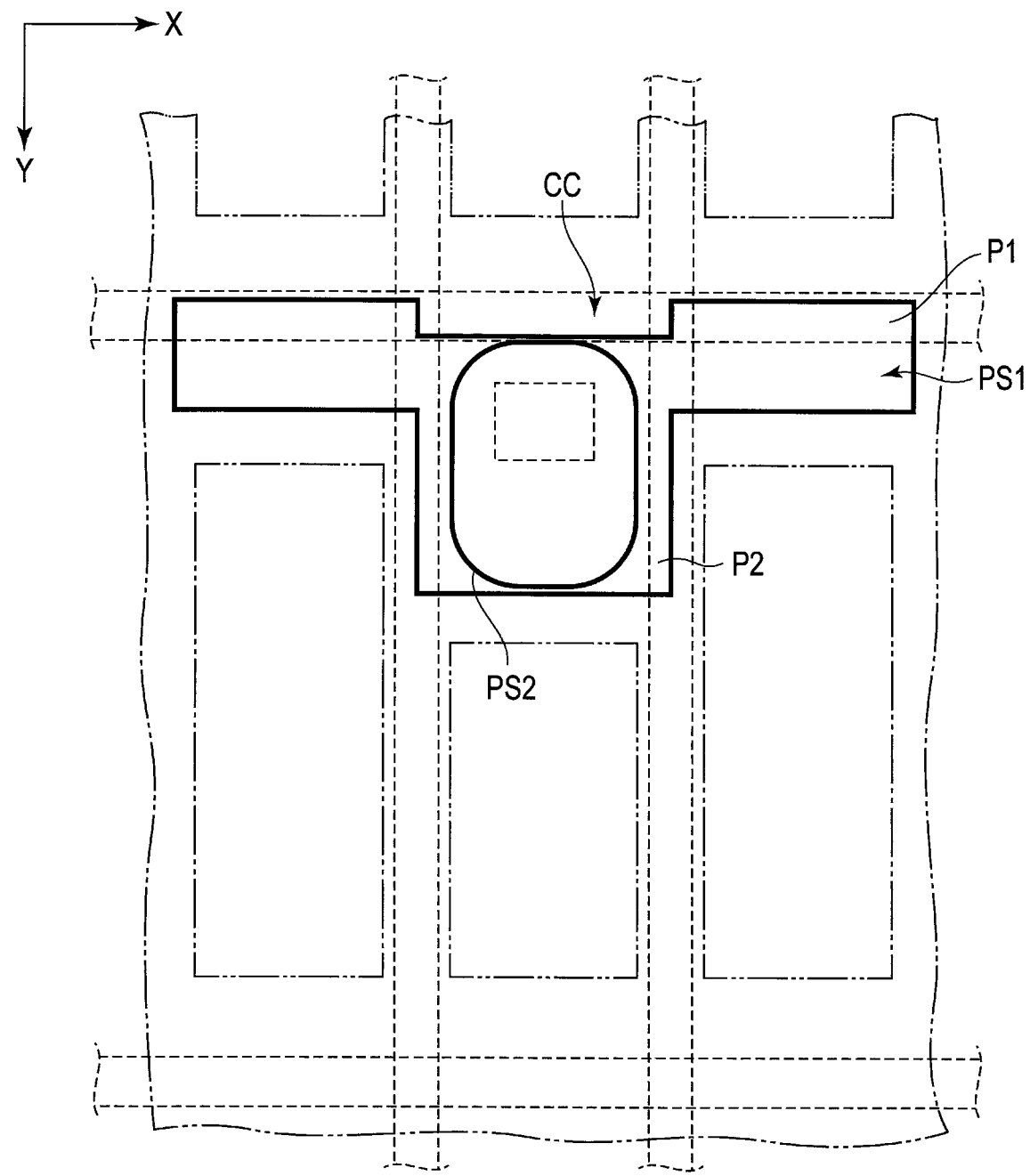
F I G. 13

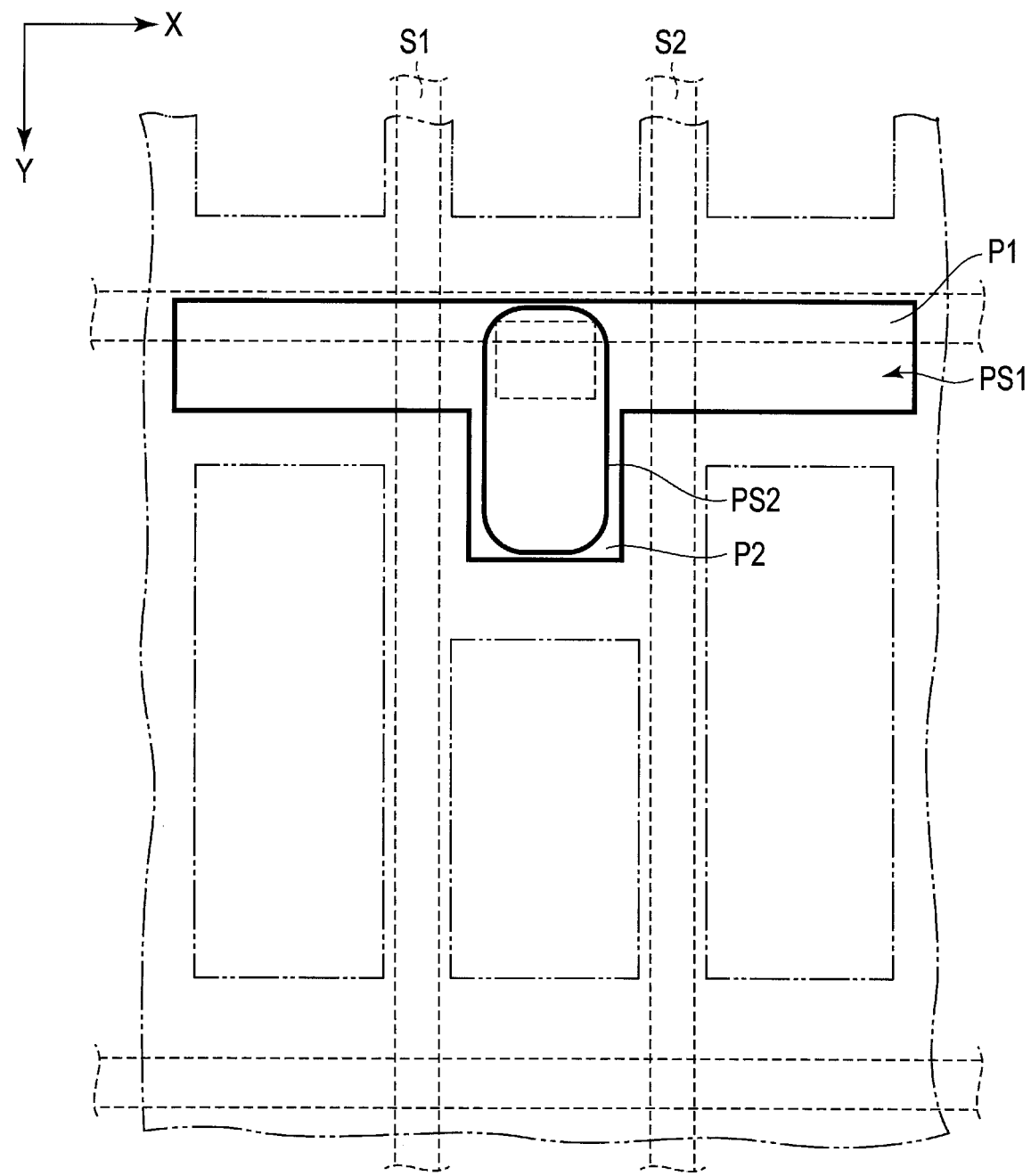
F I G. 14

DISPLAY DEVICE

CROSS-REFERENCE TO RELATED APPLICATIONS

This application is a continuation of U.S. application Ser. No. 17/562,341, filed Dec. 27, 2021, which is a continuation of U.S. application Ser. No. 17/003,326 filed Aug. 26, 2020, and which is a continuation of U.S. application Ser. No. 16/232,218 filed Dec. 26, 2018, which is based upon and claims the benefit of priority from Japanese Patent Application No. 2017-249823, filed Dec. 26, 2017, the entire contents of each of which are incorporated herein by reference.

FIELD

Embodiments described herein relate generally to a display device.

BACKGROUND

A liquid crystal display device in which a spacer is provided on each of a first substrate and a second substrate has been developed. In such a liquid crystal display device, when the spacers provided on both the first substrate and the second substrate are brought into contact with each other, respectively, thus forming cell gaps. In recent years, display devices are used for display of, for example, virtual reality, augmented reality and the like, and therefore there is a demand of finer details in structure. As the devices become finer and more details in structure, the size of spacers as compared to pixels become more negligible, which may become a factor of degrading the display quality.

BRIEF DESCRIPTION OF THE DRAWINGS

FIG. 1 is a diagram showing a configuration of a display device 1 of an embodiment.

FIG. 3 is a plan view showing a configuration example of a main spacer MS of the display device 1.

FIG. 7 is a cross section taken along line C-C' shown in FIG. 6.

FIG. 10 is a plan view showing main spacers MS adjacent to each other along a first direction X.

FIG. 13 is a plan view showing another example of the main spacer.

FIG. 14 is a plan view showing another example of the main spacer.

DETAILED DESCRIPTION

Figure 2:
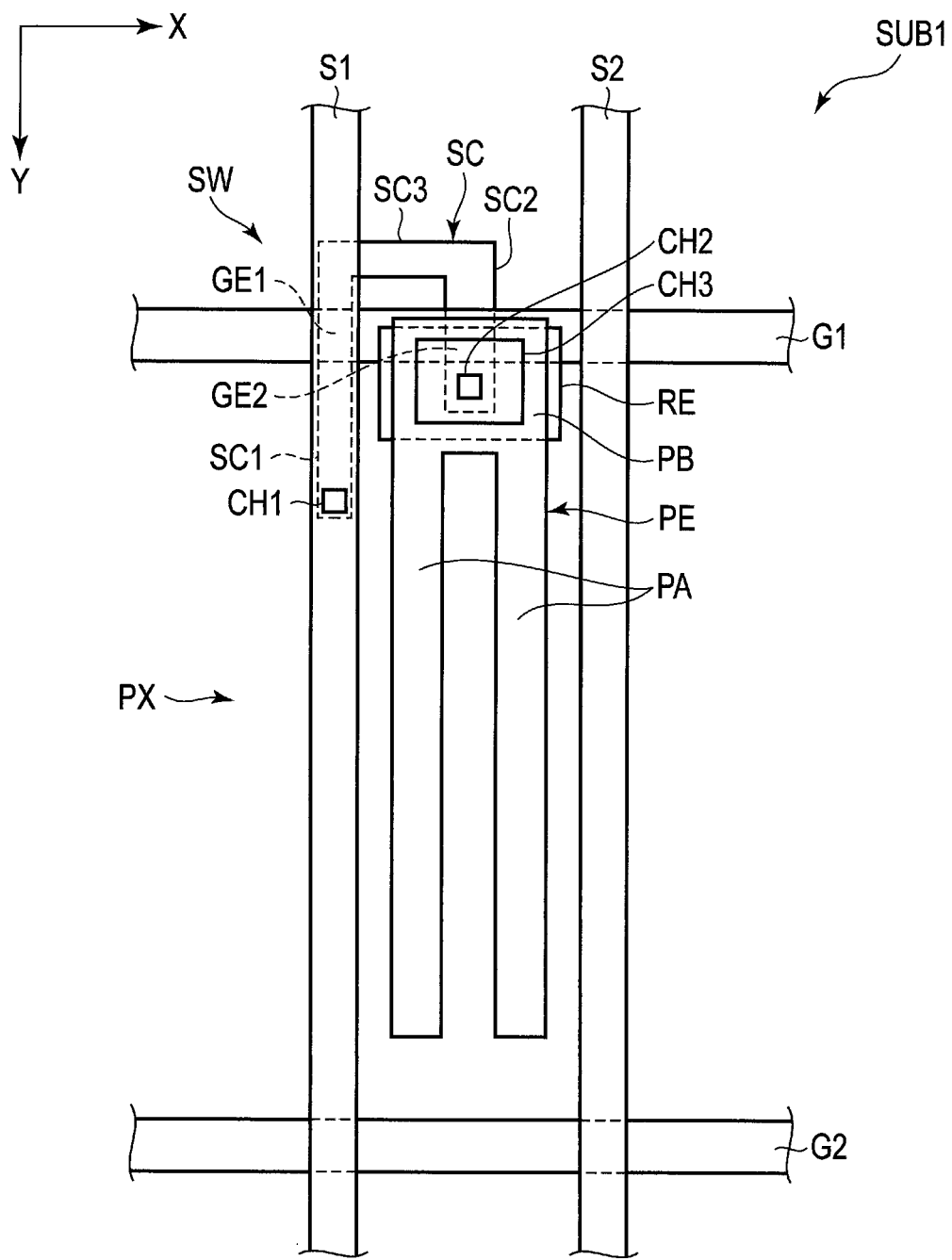
FIG. 2 is a plan view showing a configuration of a pixel PX shown in FIG. 1.

In general, according to one embodiment, a display device comprises a first substrate including a first signal line and a second signal line adjacent to each other along a first direction, an organic insulating film located on the first signal line and the second signal line, and a first spacer located on the organic insulating film and a second substrate opposing the first substrate and including a second spacer opposing the first spacer, the organic insulating film having a through-hole between the first signal line and the second signal line in plan view, and the first spacer being provided to overlap the through-hole in plan view and filling the through-hole.

According to another embodiment, a display device comprises a first substrate including a first signal line and a second signal line adjacent to each other along a first direction, an organic insulating film which covers the first signal line and the second signal line, a switching element with a relay electrode provided between the first signal line and the second signal line, a pixel electrode connected to the relay electrode, and a filler provided on the pixel electrode, a second substrate opposing the first substrate and a display function layer provided the first substrate and the second substrate, the organic insulating film having a first through-hole between the first signal line and the second signal line in plan view, the first through-hole being disposed above on the relay electrode, the pixel electrode including a connection portion connected to the relay electrode in the first through-hole, and the filler being provided on the connection portion to fill the first through-hole.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

FIG. 1 is a diagram showing a configuration of a display device 1 according to this embodiment. A first direction X and a second direction Y shown in the figure cross each other. For example, the first direction X and the second direction Y are orthogonal to each other but may intersect at an angle other than 90 degrees.

The display device 1 comprises a display panel 2, a driver IC chip 3 and the like. The display panel 2 is, for example, a liquid crystal display panel, and comprises a first substrate SUB1, a second substrate SUB2, and a liquid crystal layer (a liquid crystal layer LC which will be later) which serves as a display function layer. The first substrate SUB1 and the second substrate SUB2 oppose each other and they are attached together by a sealant SE. The liquid crystal layer is located in a region surrounded by the sealant SE, and is interposed between the first substrate SUB1 and the second substrate SUB2.

The display panel 2 includes a display area DA which display images and a frame-like non-display area NDA surrounding the display area DA. The display area DA substantially overlaps the region where the liquid crystal layer is provided. The display panel 2 includes a plurality of pixels PX in the display area DA. In the example illustrated, the pixels PX are arranged in a matrix along the first direction X and the second direction Y. Further, the display panel 2 includes, in the non-display area NDA, the driver IC chip 3 for driving the pixels PX. In the example illustrated, the driver IC chip 3 is mounted on a mounting portion MT of the first substrate SUB1 which extends to an outer side of the second substrate SUB2. Note that the configuration is not limited to that of the illustrated example, but the driver IC chip 3 may be mounted on a flexible substrate connected to the display panel 2.

The display panel 2 of this embodiment may be any one of a transmissive type equipped with a transmissive display function which displays images by selectively transmitting from a rear surface side of the first substrate SUB1, a reflective type equipped a reflective display function which displays images by selectively reflecting light from a front surface side of the second substrate SUB2 and a trans-reflective type equipped with both the transmissive display function and the reflective display function.

FIG. 2 is a plan view showing a configuration of a pixel PX shown in FIG. 1. FIG. 2 illustrates the first substrate SUB1, which is one of the substrates which constitute the display panel 2. The illustrated example is equivalent to an example in which a fringe field switching (FFS) mode, which is one of the display modes which uses a lateral electric field is applied. Note that, for example, the first substrate SUB1 comprises a common electrode, but illustration of the common electrode is omitted here.

The first substrate SUB1 comprises scanning lines G1 and G2, signal lines S1 and S2, a switching element SW, a pixel electrode PE and the like. The scanning lines G1 and G2 extend along the first direction X, and are arranged along the second direction Y at intervals. The signal lines S1 and S2 extend along the second direction Y, and are arranged along the first direction X at intervals. The pixel PX is equivalent to a region surrounded by the scanning lines G1 and G2 and the signal lines S1 and S2.

The pixel electrode PE is located between the signal lines S1 and S2. The pixel electrode PE includes an electrode portion PA and a contact portion PB. The electrode portion PA is formed into a belt-like shape having substantially a fixed width, to extend along the second direction Y from the contact portion PB. The contact portion PB is located on a side of the scanning line G1 with respect to the electrode portion PA. Note that the pixel electrode PE may comprise one electrode portion PA or may comprise three or more electrode portions PA. Moreover, the electrode portion PA may extend along a direction which crosses the first direction X and the second direction Y, or may partially bend.

The switching element SW is formed between the signal line S1 and the signal line S2. The switching element SW is, for example, a double-gate thin film transistor. The switching element SW comprises a semiconductor layer SC, gate electrodes GE1 and GE2, a relay electrode RE and the like.

The semiconductor layer SC includes a first portion SC1, a second portion SC2 and a third portion SC3. The first portion SC1 is located directly under the signal line S1. The first portion SC1 extends along the second direction Y and crosses the scanning line G1. The first portion SC1 is electrically connected to the signal line S1 in a contact hole CH1. The signal line S1 functions as, for example, a source electrode of the switching element SW. The second portion SC2 is located between the signal lines S1 and S2. The second portion SC2 extends along the second direction Y and crosses the scanning line G1. The second portion SC2 is electrically connected to the relay electrode RE in a contact hole CH2. The relay electrode RE has functions as, for example, a drain electrode of the switching element SW. The third portion SC3 extends along the first direction X and connects the first portion SC1 and the second portion SC2 to each other.

The third portion SC3 and the second portion SC2 are partially located in a pixel region shifted from the pixel PX by one pixel along the second direction Y (that is, a pixel adjacent to the pixel PX along the second direction Y).

The gate electrode GE1 is equivalent to a region of the scanning line G1, which overlaps the first portion SC1. The gate electrode GE2 is equivalent to a region of the scanning line G2, which overlaps the second portion SC2.

The pixel electrode PE is electrically connected to the relay electrode RE in a third contact hole CH3. Thus, the switching elements SW and the pixel electrode PE are electrically connected to each other. The contact hole CH3 is located between the signal line S1 and the signal line S2, and is formed in a region where the pixel electrode PE and the contact portion PB overlap each other. More specifically, it is preferable that the contact hole CH3 be formed at a center between of the pair of signal lines S1 and S2.

FIG. 3 is a plan view showing a configuration example of a main spacer MS of the display device 1. The main spacer MS comprises a first spacer PS1 and a second spacer PS2. The first spacer PS1 is provided in the first substrate SUB1. The second spacer PS2 is provided in the second substrate SUB2. The first spacer PS1 includes a first portion P1 and a second portion P2. The first portion P1 is formed into a belt-like shape having substantially a fixed width, to extend along the first direction X. The first portion P1 overlaps the entire contact hole CH3 shown in FIG. 2. In the example illustrated, the first portion P1 overlaps the scanning line G1 as well. The second portion P2 projects from the first portion P1 in the second direction Y near the contact hole CH3. The second portion P2 and the contact hole CH3 are arranged along the second direction Y. In the example illustrated, the second portion P2 has substantially a rectangular shape. In the example illustrated, an edge E21 of the second portion P2 overlaps the signal line S1. An edge E22 of the second portion P2 overlaps the signal line S2.

A length (first length) L1 of the first portion P1 along the first direction X is greater than a length (second length) L2Y of the second portion P2 along the second direction Y. That is, the first spacer PS1 is has a shape elongated in the first direction as a whole. In the example illustrated, the first portion P1 crosses the signal line S1 and the signal line S2, but the first portion P1 may cross some other signal line.

The second spacer PS2 overlaps the first portion P1 and the second portion P2. The second spacer PS2 extends in the second direction Y further than the first portion P1. That is, an edge EP2 of the second spacer PS2 on a side of the scanning line G2 is closer to the scanning line G2 than from an edge EP1 of the first portion P1 on a side of the scanning line G2. In the example illustrated, the second spacer PS2 entirely overlaps the first spacer PS1, but it may partially overlap the first spacer PS1. In the example illustrated, the second spacer PS2 is located between the signal line S1 and the signal line S2 along the first direction X.

A length (fifth length) L2X of the second spacer PS2 along the first direction X is less than a distance (second distance) DS1 between inner edges of the signal line S1 and the signal line S2. The inner edge of the signal line S1 is one of the edges of the signal line S1, which oppose the signal line S2 and the inner edge of the signal line S2 is one of the edges of the signal line S2, which opposes the signal line S1.

As indicated by an alternate long and two short dashes line in the figure, a light-shielding layer BM overlaps the first spacer PS1 and the second spacer PS2. The light-shielding layer BM comprises a first opening OP1 and a second opening OP2. The first opening OP1 opposes the second spacer PS2 and the second portion P2 along the second direction Y. The first opening OP1 and the second opening OP2 are adjacent to each other along the first direction X.

A length (sixth length) LO2 of the second opening OP2 is greater than a length (seventh length) LO1 of the first opening OP1. More specifically, the first opening OP1 comprises edges EO11 and EO12 extending along the first direction X. The edge EO11 is located on a scanning line G1 side and the edge EO12 is located on a scanning line G2 side. The second opening OP2 comprises edges EO21 and EO22 extending along the first direction X. The edge EO21 is located on the scanning line G1 side and the edge EO22 is located on the scanning line G2 side. The location of the edge EO12 along the second direction Y and the location of the edge EO22 along the second direction Y coincide with each other. On the other hand, the edge EO11 is spaced apart from the scanning line G1 further from the edge EO21.

Figure 4:
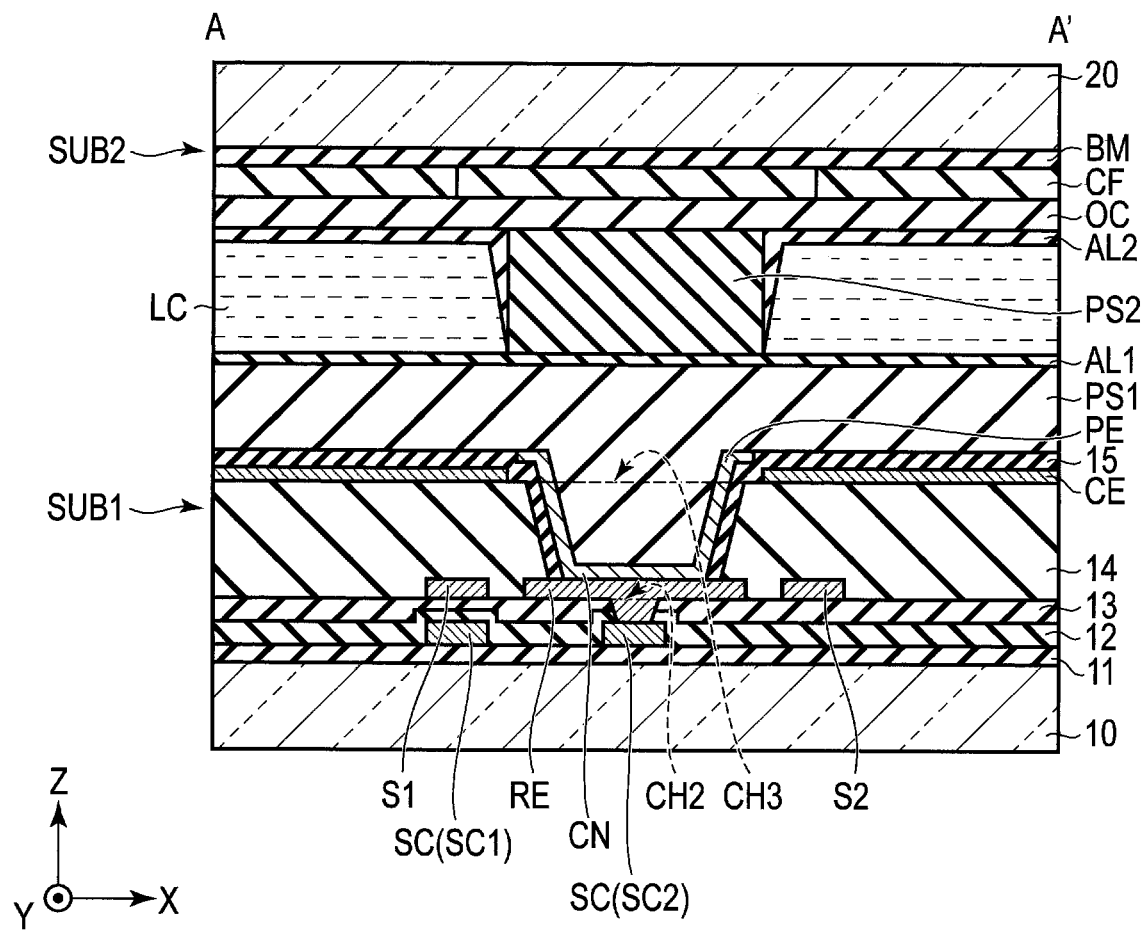
FIG. 4 is a cross section taken along line A-A' shown in FIG. 3.

FIG. 4 is a cross section taken along line A-A' shown in FIG. 3. The first substrate SUB1 comprises an insulating substrate 10, first to fifth insulating films 11 to 15, semiconductor layers SC, a relay electrode RE, signal lines S1 and S2, a common electrode CE, a pixel electrode PE, a first spacer PS1 and a first alignment film AL1.

The first insulating film 11 is disposed on the insulating substrate 10. The semiconductor layers SC are located on the first insulating substrate 11, and covered by with the second insulating film 12. The semiconductor layers SC may be formed from, for example, a transparent amorphous oxide semiconductor (TAOS) or polycrystalline silicon.

The signal lines S1 and S2 and the relay electrode RE are formed on the third insulating film 13 and covered by the fourth insulation film 14. The relay electrode RE is in contact with the semiconductor layers SC via the contact hole CH2 which penetrates the second insulating film 12 and the third insulating film 13. The signal lines S1 and S2, the relay electrode RE and the scanning lines G1 and G2 may be formed from a metal material such as aluminum (Al), titanium (Ti), silver (Ag), molybdenum (Mo), tungsten (W), copper (Cu) or chromium (Cr), or an alloy of any combination of the metal materials, and each may be of a single- or multi-layer structure.

The fourth insulating film 14 covers the signal lines S1 and S2 and the relay electrode RE. The fourth insulating film 14 comprises a contact hole CH3 which penetrates therethrough to the relay electrode RE. The common electrode CE is located on the fourth insulating film 14 and covered by the fifth insulating film 15. In the example illustrated, the fifth insulating film 15 covers the fourth insulating film 14 and is in contact also the relay electrode RE in the contact hole CH3. The first insulating film 11, the second insulating film 12, the third insulating film 13, and the fifth insulating film 15 are each formed from, for example, an inorganic insulating material such as silicon oxide, silicon nitride or silicon oxynitride. The fourth insulating film 14 is formed from, for example, an organic insulating material such as polyimide.

The pixel electrode PE is located on the fifth insulating film 15 in a region substantially overlapping the contact hole CH3. The pixel electrode PE is in contact with the relay electrode RE in the contact hole CH3. That is, the pixel electrode PE comprises a connection portion CN connected to the relay electrode RE in the contact hole CH3. The common electrode CE and the pixel electrode PE are formed from a transparent conductive material such as indium-tin-oxide (ITO) or indium-zinc-oxide (IZO).

The first spacer PS1 is located on the pixel electrode PE and the fifth insulating film 15. The first spacer PS1 is provided to cover the connection portion CN and to fill the contact hole CH3. Thus, the unevenness created around the pixel electrode PE due to the contact hole CH3 is lessened. Moreover, the first spacer PS1 is covered also by the first alignment film AL1 as well as by the pixel electrode PE, and the like. The first spacer PS1 is formed from, for example, an organic insulating material such as polyimide.

The second substrate SUB2 comprises an insulating substrate 20, a light-shielding layer BM, color filters CF, an overcoat layer OC, a second spacer PS2, a second alignment film AL2 and the like. The light-shielding layer BM and the color filter CF are located on a side of the second insulating substrate 20, which opposes the first substrate SUB1. The light-shielding layer BM is formed from, for example, a resin material colored in black, as a partition for each pixel. The overcoat layer OC covers the color filters CF.

The second spacer PS2 is located between the overcoat layer OC and the first substrate SUB1. In the example illustrated, the second spacer PS2 is located right above the contact hole CH3. The second spacer PS2 is formed from, for example, an organic insulating material such as polyimide. The second alignment film AL2 covers the overcoat layer OC and also the side surface of the second spacer PS2.

In the first substrate SUB1 and the second substrate SUB2 configured as above, the first alignment film AL1 and the second alignment film AL2 are disposed to oppose each other. As the first spacer PS1 and the second spacer PS2 are brought into contact with each other, a predetermined cell gap is formed between the first alignment film AL1 and the second alignment film AL2. The liquid crystal layer LC is filled into the cell gap. Note that between the first spacer PS1 and the second spacer PS2, at least one of the first alignment film AL1 and the second alignment film AL2 may be interposed, or the first alignment film AL1 and the second alignment film AL2 may not necessarily be interposed therebetween.

Figure 5:
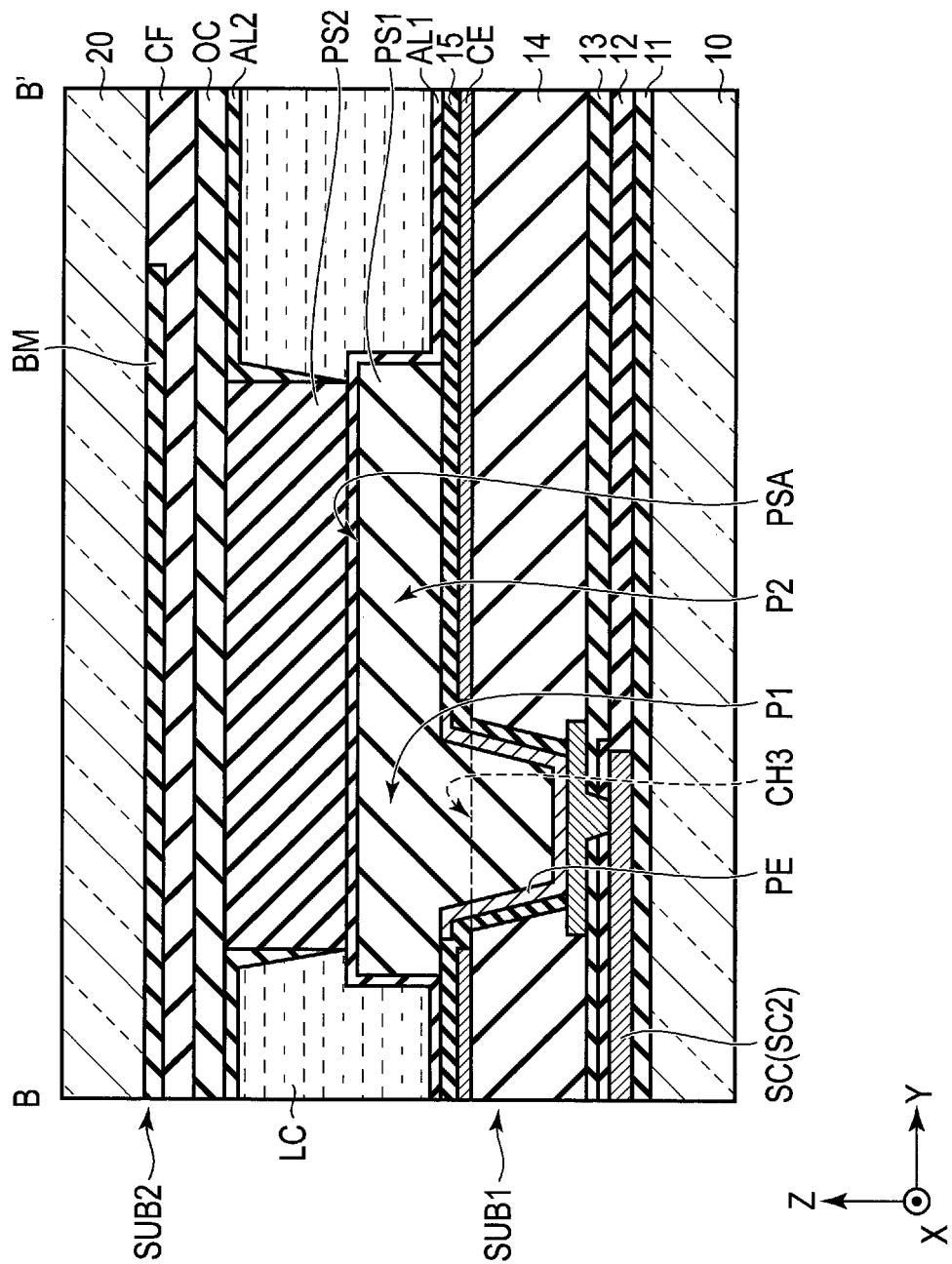
FIG. 5 is a cross section taken along line B-B' shown in FIG. 3.

FIG. 5B is a cross section taken along line B-B' shown in FIG. 3. The first portion P1 and the second portion P2 of the first spacer PS1 are formed integrally as one body. In the example illustrated, a height of an upper surface of the first portion P1 and a height of an upper surface of the second portion P2 substantially coincide with each other. That is, the upper surface PSA of the first spacer PS1 is substantially flat.

Figure 6:
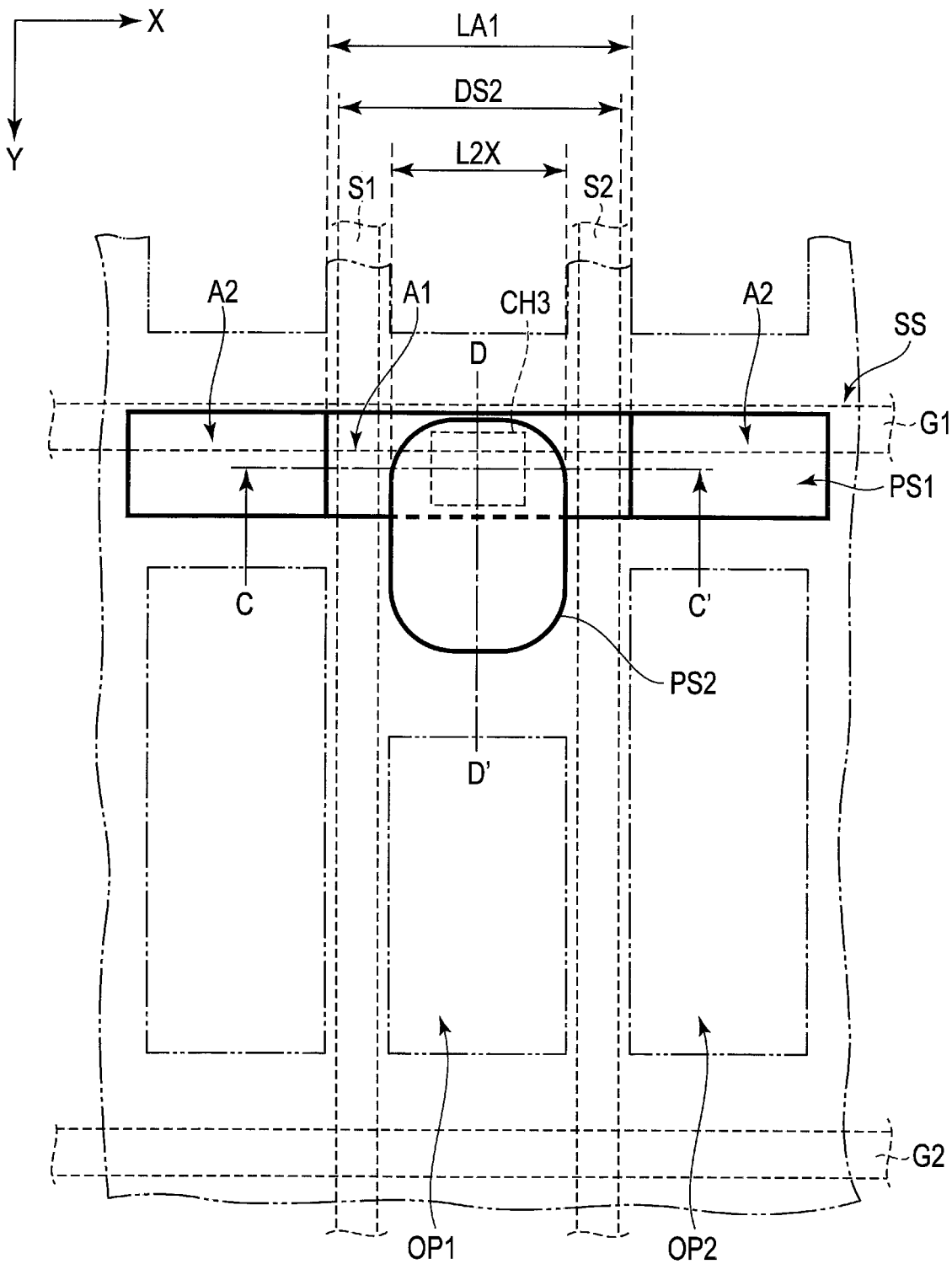
FIG. 6 is a plan view showing a configuration example of a sub-spacer SS of the display device 1.

FIG. 6 is a plan view showing a sub-spacer SS provided in the display device 1. The sub-spacer SS comprises a first spacer PS1 and a second spacer PS2, as in the case of the main spacer MS. The first spacer PS1 is provided in the first substrate SUB1. The second spacer PS2 is provided in the second substrate SUB2.

In the sub-spacer SS, the first spacer PS1 does not include the second portion P2, and is substantially formed from only the first portion P1. In the example illustrated, the first spacer PS1 is formed into a belt-like shape having substantially a fixed width, and extends along the first direction X in plan view. The first spacer PS1 includes a first area A1 which overlaps the second spacer PS2, and two second areas A2. The first area A1 is located between the two second areas A2.

A length (fourth length) LA1 of the first area A1 along the first direction X is greater than a length L2X of the second spacer PS2 along the first direction X. Further, the length LA1 is greater than or equal to a distance (first distance) DS2 between outer edges of the signal line S1 and the signal line S2. Here, the outer edge of the signal line S1 is one of the edges of the signal line S1, on a side opposite to the signal line S2, and the outer edge of the signal line S2 is one of the edges of the signal line S2, on a side opposite to the signal line S2.

In the sub-spacer SS as well, the second spacer PS2 extends further from the first spacer PS1 along the second direction Y. With this structure, a length of the first opening OP1 opposing the second spacer PS2 along the second direction Y is less than a length of the second opening OP2. Here, the lengths are dimensions taken along the second direction Y.

FIG. 7 is a cross section taken along line C-C' shown in FIG. 6. In the example illustrated, the second spacer PS2 entirely overlaps the first area A1. The first area A1 has a thickness (first thickness) T1. The second area A2 has a thickness (second thickness) T2. The thickness T1 is less than the thickness T2. In other words, the first spacer PS1 comprises a concavity PSC formed by the first area A1 and the second area A2.

As illustrated, while the display surface is not being pressurized, the second spacer PS2 is spaced apart from the first spacer PS1. Between the second spacer PS2 and the first spacer PS1, the liquid crystal layer LC is interposed. At this time, an end portion ES2 of the second spacer PS2, on a side opposing the first spacer PS1 is located below an upper surface A2A of the second area A2 along the third direction Z. That is, the end portion ES2 is located within the concavity PSC. With this structure, if the second spacer PS2 and the first spacer PS1 are displaced relatively with respect to each other along the first direction X while the display surface being not pressurized, the displacement along the first direction X is suppressed by bringing the second spacer PS2 and the side surface SP1 of the first spacer PS1 into contact with each other.

Note that such a structure can adopted as well that the end portion ES2 of the second spacer PS2 does not enter the concavity PSC while the display surface being not pressurized unlike the case described above, and it is located above the upper surface A2A of the second area A2.

Moreover, while the display surface is being pressurized, the second spacer PS2 is, in some cases, brought into contact with the first area A1. Similarly, even in the case where the second spacer PS2 and the first spacer PS1 are displaced relatively with respect to each other along the first direction X while the display surface being pressurized, the displacement along the first direction X is suppressed by bringing the second spacer PS2 and the side surface SP1 of the first spacer PS1 into contact with each other.

Note that in the sub spacer SS as well, the concavity of the contact hole CH3 is filled with the first spacer PS1.

Figure 8:
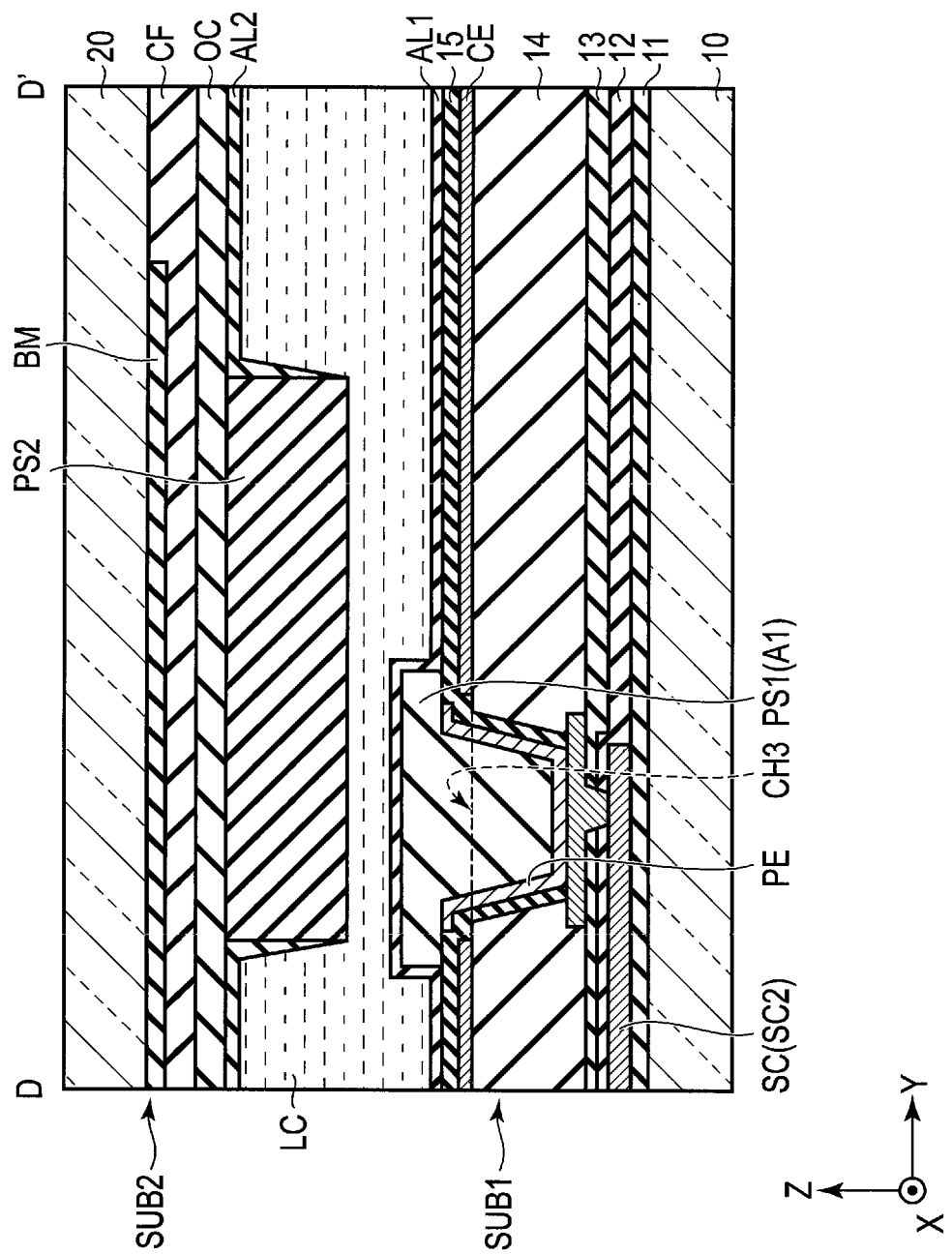
FIG. 8 is a cross section taken along line D-D' shown in FIG. 6.

FIG. 8 is a cross section taken along line D-D' shown in FIG. 6. Since, here, the first spacer PS1 does not include the second portion P2, the second spacer PS2 partially opposes the first spacer PS1.

Figure 9:
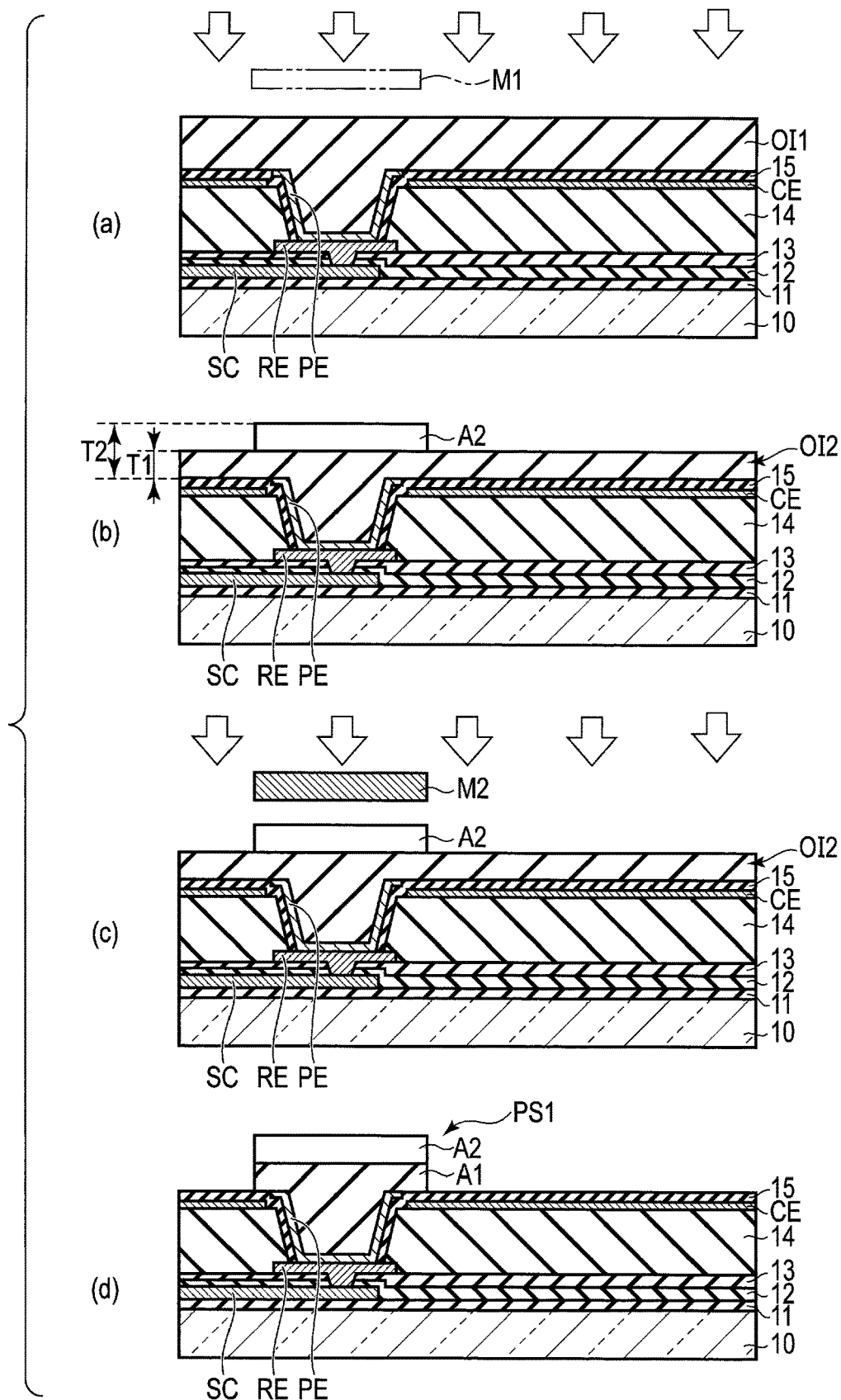
FIG. 9 is a cross section showing an example of a method of forming a first spacer PS1 shown in FIG. 8.

FIG. 9 is a cross section showing an example of a method of forming the first spacer PS1 of the sub-spacer shown in FIG. 8. As shown in FIG. 9, part (a), a layer OI1 formed from, for example, an organic insulating material such as polyimide is formed on the pixel electrode PE and the fifth insulating film 15. Subsequently, as indicated by an alternate long and two short dashes line in FIG. 9, part (a), a mask M1 is placed onto a region corresponding to the second area A2. Then, the layer OI1 is exposed.

Next, as shown in FIG. 9, part (b), the layer OI1 is developed, thereby forming a layer OI2. Here, in the region shielded by the mask M1, the second area A2 having a thickness T2 is formed. On the other hand, the exposed region has a thickness T1, which is less than the thickness T2.

Next, as shown in FIG. 9, part (c), a mask M2 is placed on a region corresponding to the first area A1 and the second area A2. The mask M2 overlaps the contact hole CH3. After that, the layer OI2 is exposed.

Next, the layer OI2 is developed as shown in FIG. 9, part (d). Thus, the layer OI2 is removed in the exposed region, and the first area A1 having the thickness T1 is formed. By the processing steps discussed above, the first spacer PS1 involving the two thicknesses T1 and T2 is formed.

FIG. 10 is a plan view showing main spacers MS adjacent to each other along the first direction X. The main spacer MS1 comprises a first spacer PS11 and a second spacer PS21. The arrangement of the first spacer PS11 and the second spacer PS21 is similar to that of the first spacer PS1 and the second spacer PS2 shown in FIG. 3. That is, the first spacer PS11 includes a portion P11 extending along the first direction X and a portion P21 extending from the portion P11 in the second direction Y.

The main spacer MS2 comprises a first spacer PS12 and a second spacer PS22. The arrangement of the first spacer PS12 and the second spacer PS22 is equivalent to the arrangement of the first spacer PS11 and the second spacer PS21, which is rotated by 180 degrees in the X-Y plane. More specifically, the first spacer PS12 includes a portion (fourth portion) P12 and the portion (fifth portion) P22. The portion P12 extends along the first direction X as in the case of the portion P11. For example, the location of the portion P12 coincides with the location to where the portion P11 extends. On the other hand, the portion P22 projects in a direction oppose to that of the portion P21.

The second spacer PS22 overlaps the portion P12 and the portion P22. Therefore, the second spacer PS22 and the second spacer PS21 extending in directions opposite to each other with regard to the portions P11 and P12. That is, the second spacer PS22 is located on a side spaced away from the scanning line G2 further than from the second spacer PS21. Therefore, the length of the opening OP3, which opposes the portion P22 and the second spacer PS22, along the second direction Y is less than the length of the opening OP4 along the second direction Y. The opening OP3 and the opening OP4 are adjacent to each other along the first direction X.

With the above-described structure, even if the second substrate SUB2 is displaced with relative to the first substrate SUB1 along the second direction Y, the state where the portion P21 and the second spacer PS21 overlap each other is maintained. Moreover, even if the second substrate SUB2 is displaced with relative to the first substrate SUB1 along a direction opposite to the second direction Y, the state where the portion P22 and the second spacer PS22 overlap each other is maintained.

Note that the above-described arrangement can be applied also to the sub-spacers SS adjacent to each other along the first direction X.

Figure 11:
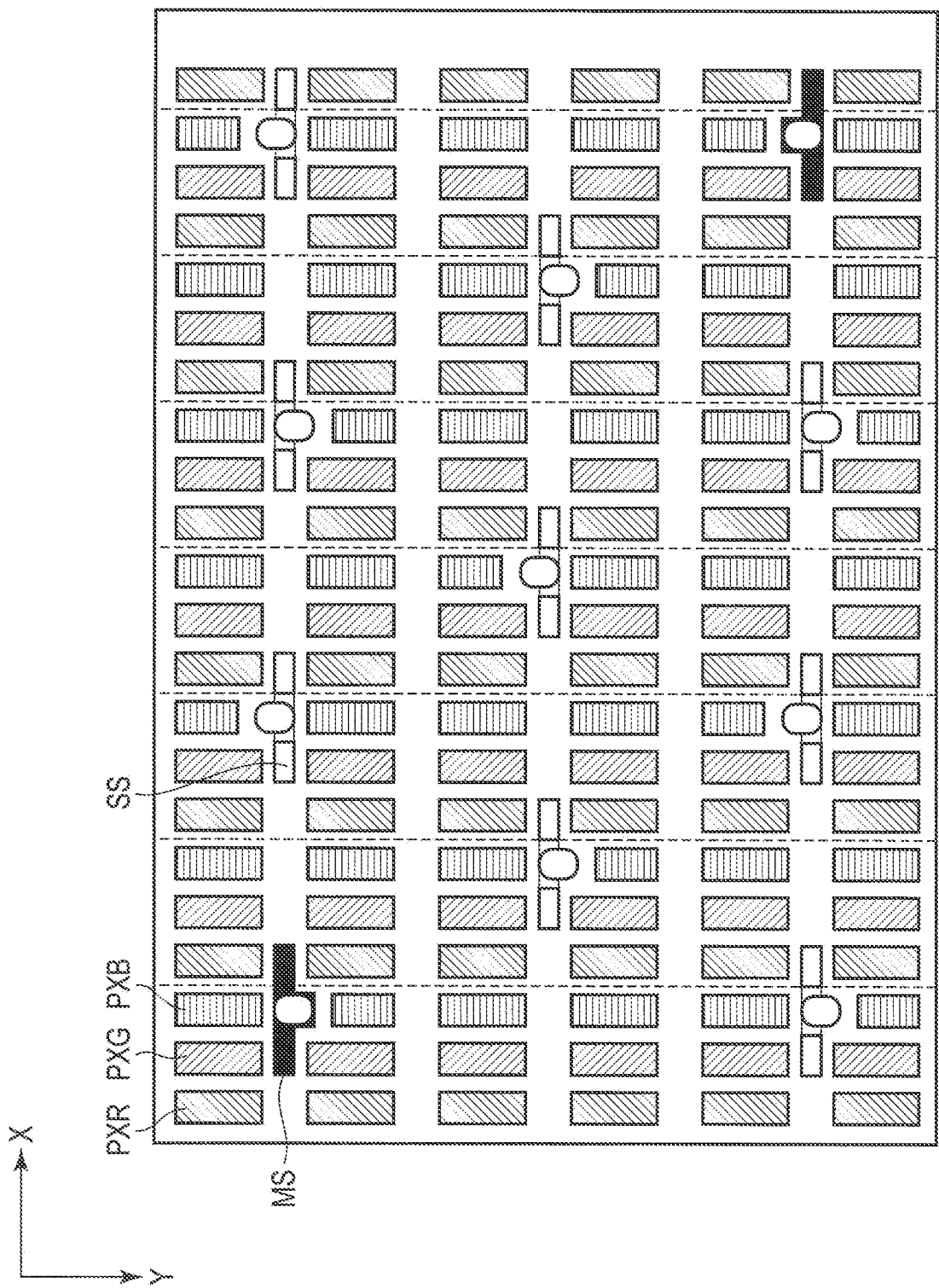
FIG. 11 is a plan view showing an example of arrangement of main spacers MS shown in FIG. 3 and sub-spacers SS shown in FIG. 6.

FIG. 11 is a plan view showing an example of arrangement of the main spacers MS shown in FIG. 3 and the sub-spacers SS shown in FIG. 6. In the figure, the first spacer PS1 of each of the main spacers MS is in black.

In the example illustrated, the display device 1 comprises pixels PXR emitting red, pixels PXG emitting green and pixels PXB emitting blue. A red color filter is disposed on each of the pixels PXR. The pixels PXR are indicated by upward-sloping hatch lines in the figure. A green color filter is disposed on each of the pixels PXG. The pixels PXG are indicated by downward-sloping hatch lines in the figure. A blue color filter is disposed on each of the pixels PXB. The pixels PXB are indicated by horizontal lines in the figure.

The pixels PXR, PXG and PXB are all arranged along the second direction Y. Moreover, the pixels PXR, PXG and PXB are arranged along the first direction X in this order.

For example, the main spacers MS and the sub-spacers SS are each disposed near the respective pixels PXB. More specifically, the second spacers PS2 of the main spacers MS and the sub-spacers SS, and the respective pixels PXB are arranged along the second direction Y. With such arrangement, of the pixels PXR, PXG and PXB, only the pixels PXB with low luminosity are partially shielded.

According to this embodiment, the first spacer PS1 is formed on the fifth insulating film 15 and the pixel electrode PE. The concavity formed by the contact hole CH3 is filled with the first spacer PS1. Moreover, the upper surface of the first spacer PS1 is substantially flat. Therefore, mechanical strength against the pressurization on the display surface, while the first spacer PS1 and the second spacer PS2 being in contact with each other, can be improved.

Moreover, the concavity is filled with the first spacer PS1 and therefore the first portion P1 extending along the first direction X can be formed directly above the contact hole CH3. The main spacers MS1 and MS2 arranged along the first direction X respectively comprise portions P21 and P22 projecting from the portions P11 and P12 in directions oppose to each other. With this structure, the sizes of the portions P21 and P22, which are necessary for the displacement along the second direction Y, can be reduced. Consequently, the ratio of the portion of the light-shielding layer BM, which covers the first spacer PS1 and the second spacer PS2, can be reduced, thereby making it possible to suppress the lowering of the aperture ratio.

Further, the length L2X of the second spacer PS2 along the first direction X is less than or equal to a DS1 between the inner edges of signal lines adjacent to each other. Therefore, the second spacer PS2 can be accommodated in one pixel PX in plan view. Moreover, as shown in FIG. 11, the second spacer PS2 is disposed on each of those of the pixels PX emitting a color of low luminosity, and thus non-uniformity of color tone and non-uniformity of luminance, which results from the difference in aperture ratio can be further suppressed.

Moreover, in the sub spacer SS, the first spacer PS1 includes a first area A1 and a second area A2, which have thicknesses different from each other. The thickness T1 of the first area A1 which opposes the second spacer PS2 is less than the thickness T2 of the second area A2, and the end portion ES2 of the second spacer PS2 is located within the concavity PSC formed by the first area A1 and the second area A2. With such structure, even if the second spacer PS2 and the first spacer PS1 are relatively displaced from each other along the first direction X, the second spacer PS2 and a side surface SP1 of the first spacer PS1 can be brought into contact with each other. Therefore, the gap between the first substrate SUB1 and the second substrate SUB2 along the first direction X can be suppressed. Thus, the color mixture of the pixels PXR, PXG and PXB arranged along the first direction X can be suppressed.

Further, even while the display surface being pressurized, the gap between the second spacer PS2 and the first spacer PS1 along the first direction X is suppressed in the sub spacer SS. Therefore, damaging of the first alignment film AL1, which may be caused by the displacement between the second spacer PS2 and the first spacer PS1, can be suppressed. Thus, leakage of light caused by the scratch on the first alignment film AL1 can be suppressed.

As described above, according to the embodiment, a display device with an improved display quality can be provided.

Next, another example of the main spacer MS will now be described with reference to FIGS. 12 to 15.

Figure 12:
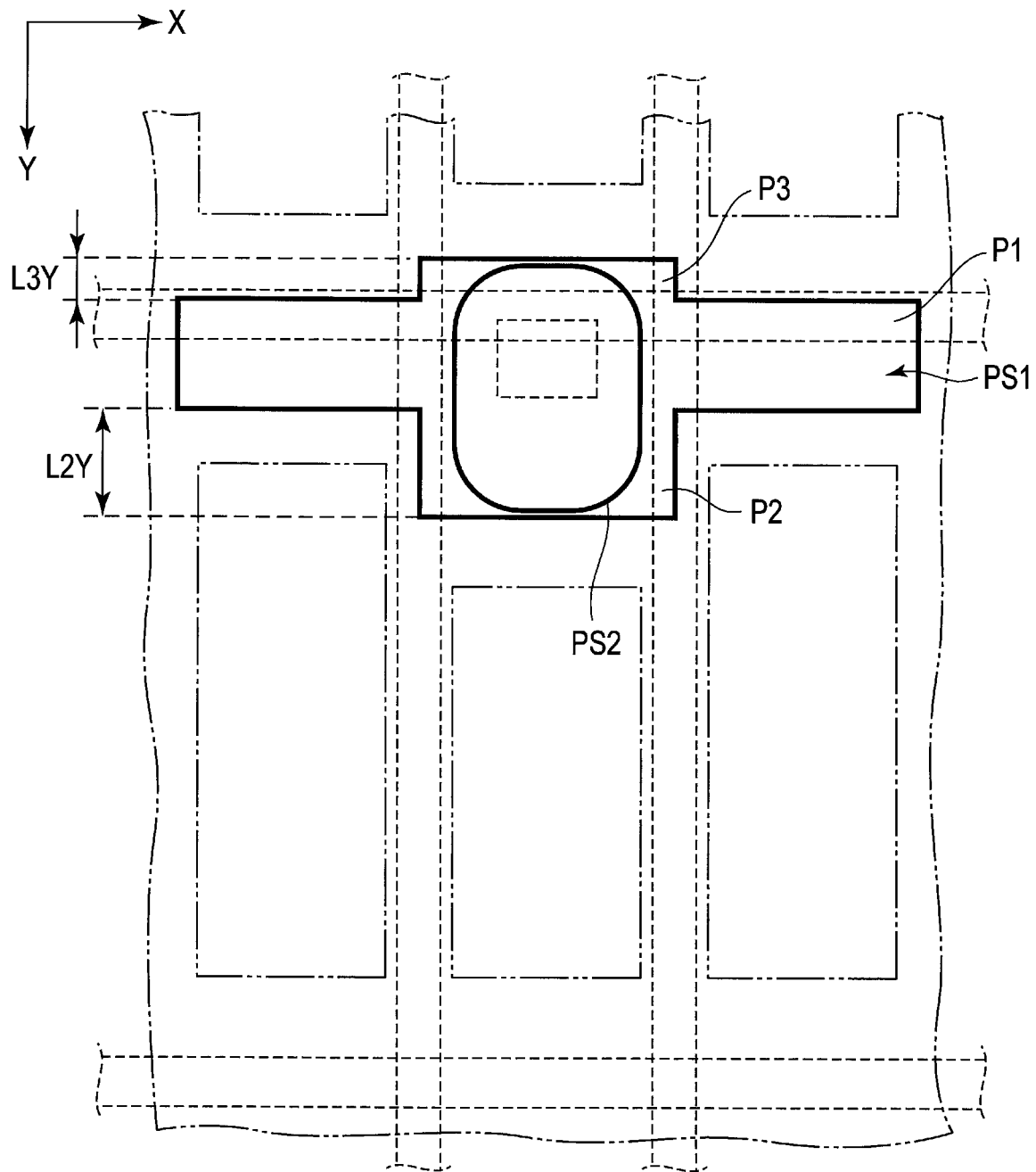
FIG. 12 is a plan view showing another example of the main spacer.

The example shown in FIG. 12 is different from that shown in FIG. 3 in that the first spacer PS1 includes a portion (third portion) P3 projecting to a side opposite to the second portion P2. A length L2Y of the second portion P2 and a length (third length) L3Y of the portion P3 are different from each other. In the example illustrated, the length L2Y is greater than the length L3Y. Note that the length L2Y may be less than the length L3Y. In this case, the first spacer PS1 is equivalent to the first spacer PS12 shown in FIG. 6. The second spacer PS2 overlaps the first portion P1, the second portions P2 and the portion P3.

The example shown in FIG. 13 is different from the example shown in FIG. 3 in that the first portion P1 comprises a concavity CC, and the concavity CC is located on an opposite side to the second portion P2. That is, the concavity CC and the second portion P2 are arranged along the second direction Y. The second spacer PS2 overlaps the first portion P1 and the second portion P2.

The example shown in FIG. 14 is different from that shown in FIG. 3 in that the second portion P2 and the second spacer PS2 are located between the signal line S1 and the signal line S2. That is, the second portion P2 does not overlap the signal line S1 or S2.

Figure 15:
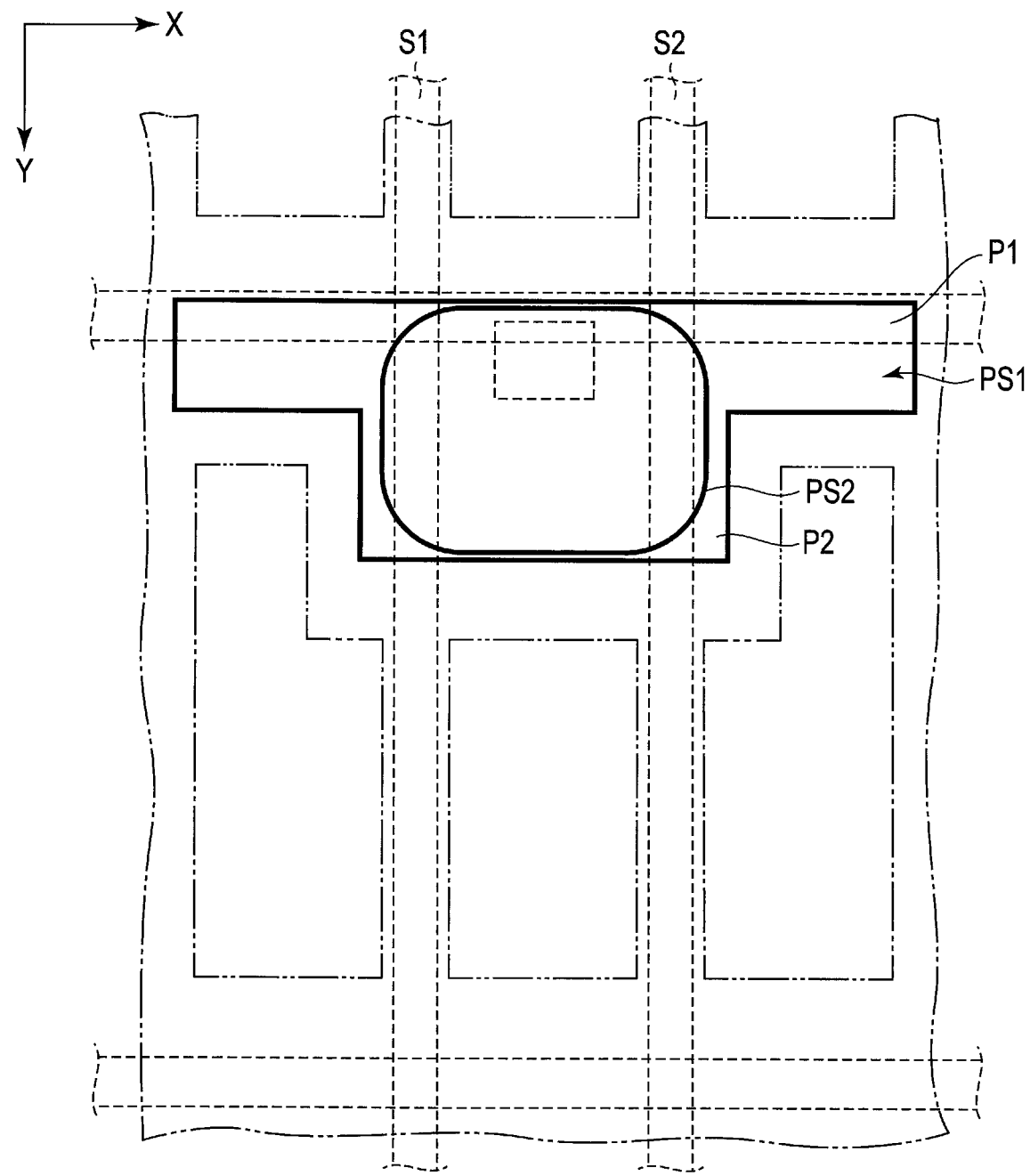
FIG. 15 is a plan view showing another example of the main spacer.

The example shown in FIG. 15 is different from that shown in FIG. 3 in that the second portion P2 and the second spacer PS2 overlap both of the signal lines S1 and S2.

In the examples shown in FIGS. 12 to 15 as well, the first spacer PS1 is formed in a region which overlaps the contact hole CH3. Therefore, an advantageous effect similar to that of the example shown in FIG. 3 can be obtained.

Figure 16:
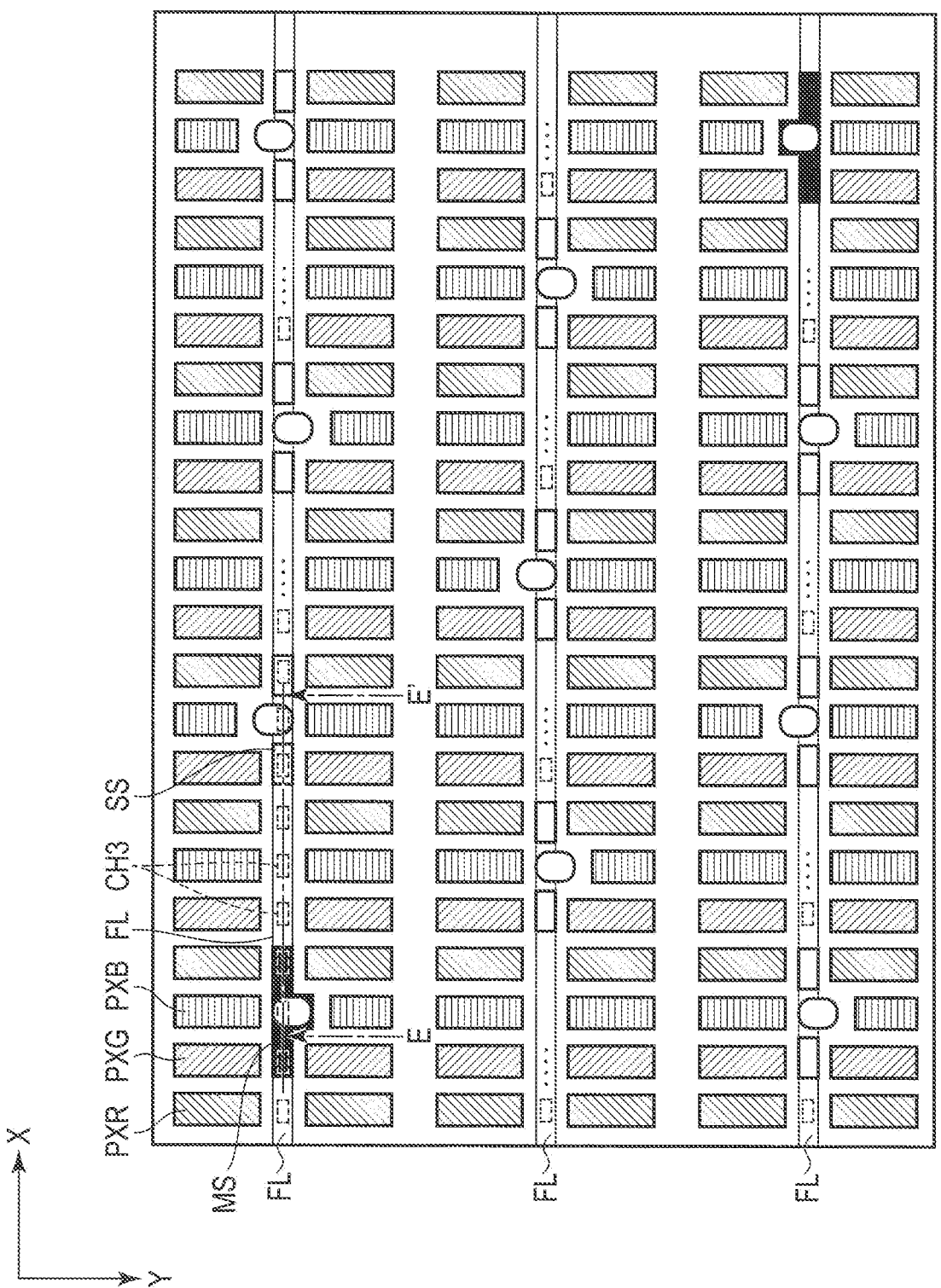
FIG. 16 is a plan view showing another example of the display device 1.

Next, other examples of the display device 1 will be described with reference to FIGS. 16 to 19. FIG. 16 is a plan view showing an example of arrangement of sub spacers SS shown in FIG. 3 and main spacers MS shown in FIG. 6. The example shown in FIG. 16 is different from that shown in FIG. 11 in fillers FL are formed between a respective pair of a main spacer MS and a sub-spacer SS adjacent to each other along the first direction X, and between a respective sub-spacer SS and a respective sub-spacer SS.

In the example illustrated, the fillers FL are each formed into a belt-like shape having a width subsequently equal to that of the main spacers MS and the first spacers PS1 of the sub spacers SS. The fillers FL each extend along the first direction X and are connected to the respective main spacers MS and sub-spacers SS. In regions where the main spacers MS and the sub-spacers SS are not provided, the fillers FL overlap the respective contact holes CH3.

Figure 17:
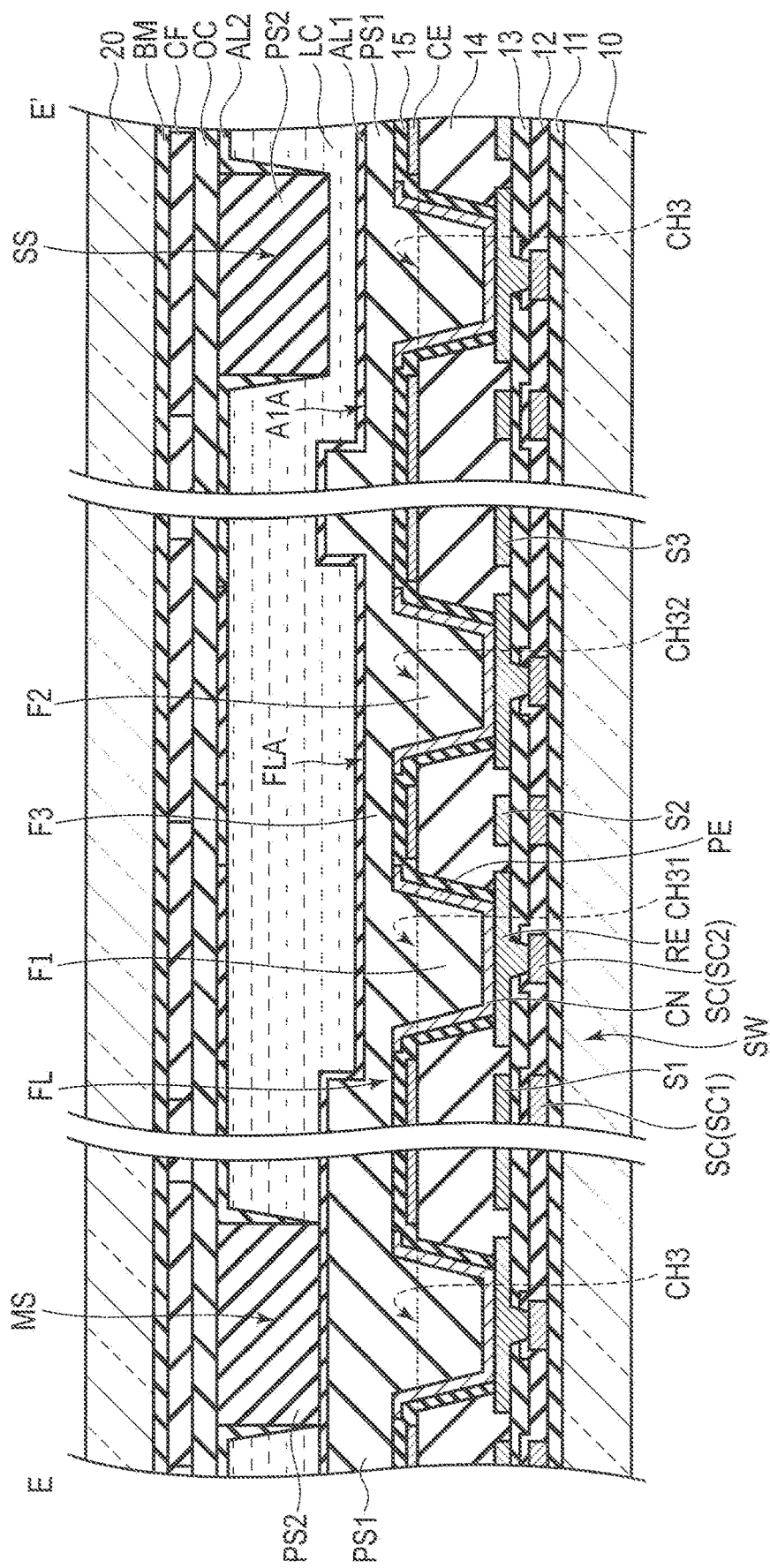
FIG. 17 is a cross section taken along line E-E' shown in FIG. 16.

FIG. 17 is a cross section taken along line E-E' shown in FIG. 16. In the example illustrated, between the main spacer MS and the sub-spacer SS, the signal lines S1, S2 and S3 are arranged along the first direction X in this order. The fourth insulating film 14 comprises contact holes CH31 and CH32 adjacent to each other along the first direction X. The contact hole (first through-hole) CH31 is located between the signal line S1 and the signal line S2 along the first direction X. The contact hole (second through-hole) CH32 is located between the signal line S2 and the signal line S3 along the first direction X. The pixel electrodes PE are connected respectively to the relay electrodes RE which constitute the switching element SW in the contact holes CH31 and CH32.

The filler FL is formed on the pixel electrodes PE and the fifth insulating film 15 in the regions where the main spacers MS and the sub-spacers SS are not provided. More specifically, the filler FL covers the connection portions CN of the pixel electrodes PE and fills the contact holes CH31 and CH32. Thus, in the regions where the main spacers MS and the sub-spacers SS are not provided, the unevenness created around the pixel electrodes PE due to the contact holes CH31 and CH32, can be lessened.

The filler FL comprises a main body portion (first main body portion) F1 provided in the contact hole CH31, a main body portion (second main body portion) F2 provided in the contact hole CH32, and a leg portion F3 extending outwards from the openings of the contact holes CH31 and CH32. The leg portion F3 extends continuously between the contact hole CH31 and the contact hole CH32, so as to connect the main body portion F1 and the main body portion F2 to each other. That is, the main body portions F1 and F2 and the leg portion F3 are formed integrally as one body.

The filler FL is formed from an organic insulating material. For example, the filler FL can be formed from a material and by a process same as those of the first spacer PS1 of the main spacer MS and the sub-spacer SS. That is, the filler FL is formed integrally with the main spacers MS and the sub-spacers SS as one body. In the example illustrated, the location of an upper surface FLA of the filler FL and the location of an upper surface A1A of the first area A1 in the sub-spacer SS substantially coincide with each other along the third direction Z. But, the location of the upper surface FLA and that of the upper surface A1A may be different from each other.

In the configuration examples shown in FIGS. 16 and 17, advantageous effect similar to those of the example shown in FIG. 3 can be obtained. Moreover, the concavity of the contact hole CH3 in each pixel PX is filled with the filler FL, the unevenness created due to the contact hole CH3 can be significantly lessened. Consequently, disorder in alignment in the liquid crystal element, which results from the concavity can be suppressed. Particularly, in the structure of the embodiment, the size of the pixels PX is small, and therefore the ratio of the contact hole CH3 in each pixel PX is large. The embodiment is effective especially in the structure involving a high-definition display area DA in which contact holes CH3 are densely and continuously arranged one next to another (that is, a display area DA including a great number of pixels PX per unit area).

Figure 18:
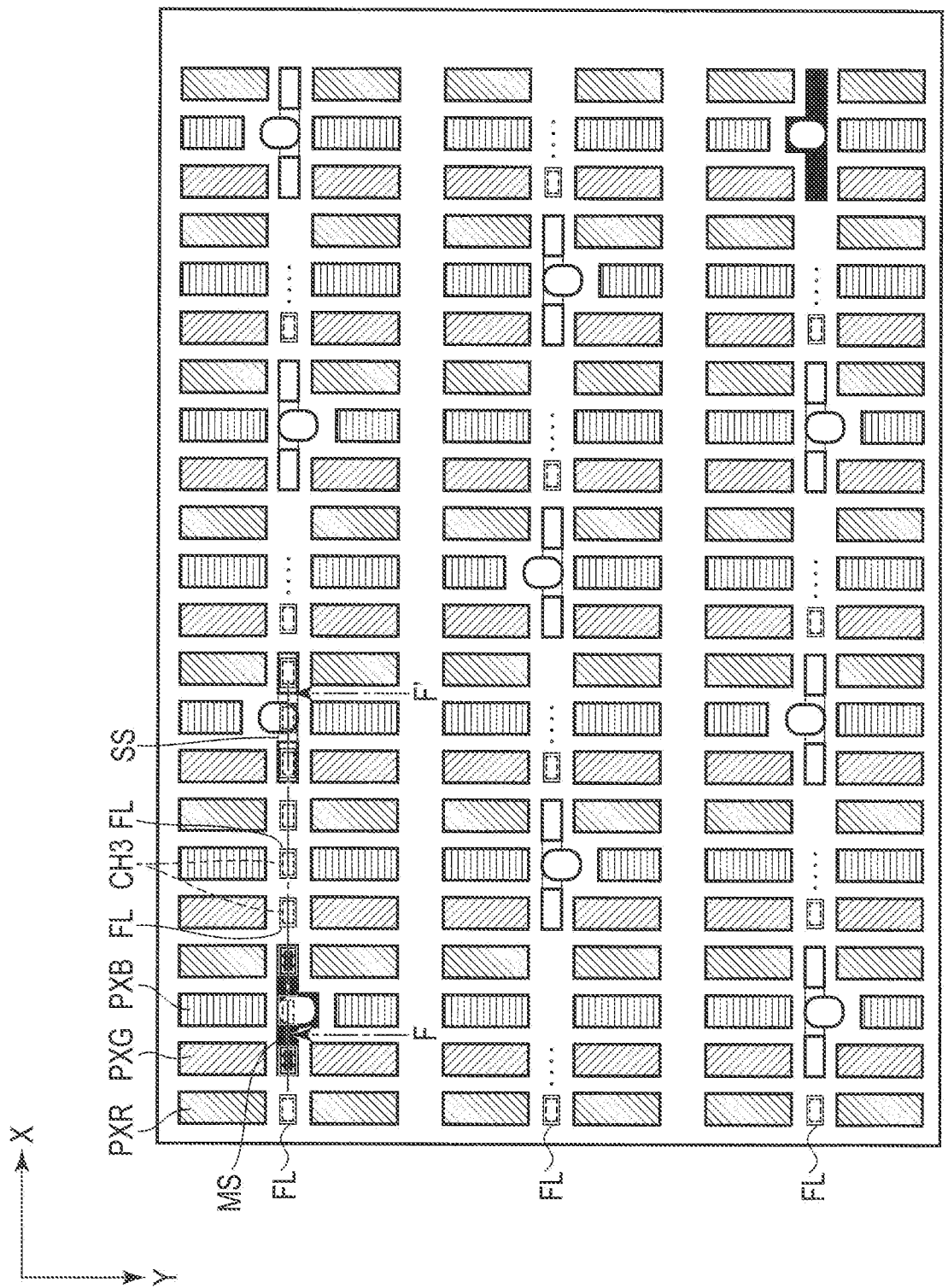
FIG. 18 is a plan view showing another example of the display device 1.

FIG. 18 is a plan view showing an example of arrangement of the main spacer MS shown in FIG. 3 and the sub-spacer SS shown in FIG. 6. The example shown in FIG. 18 is different from that of FIG. 16 in that an island-like filler FL is formed, which overlaps each of the contact holes CH3. In the example illustrated, the filler FL has the same shape as that of the contact holes CH3, and have substantially the same size as that of the contact holes CH3 in plan view. It suffices if the filler FL just covers all of the contact hole CH3, and the shape thereof is not limited to that of the example illustrated.

Figure 19:
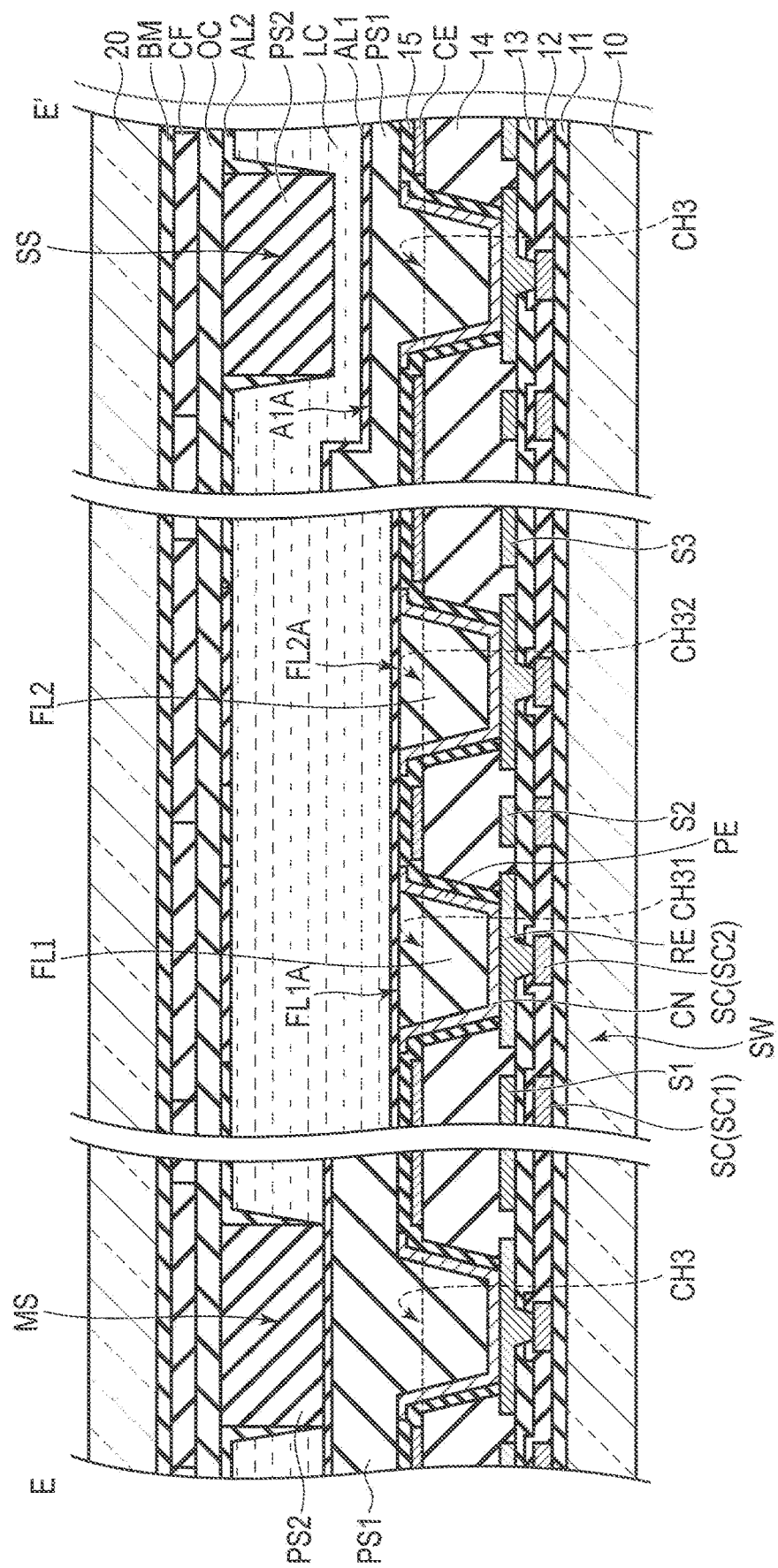
FIG. 19 is a cross section taken along line F-F' shown in FIG. 18.

FIG. 19 is a cross section taken along lines F-F' shown in FIG. 18. The contact hole CH31 is filled with the filler FL1 and the contact hole CH32 is filled with the filler FL2. The filler FL1 and the filler FL2 are not continuous to each other. In the example illustrated, an upper surface FLAT of the filler FL1 and an upper surface FL2A of the filler FL2 coincide with the upper surface of the fifth insulating film 15 along the third direction Z. Therefore, in the regions where the main spacers MS and the sub-spacer SS are not provided, the first alignment film AL1 is substantially flat.

In the examples shown in FIGS. 18 and 19 as well, the concavity of the contact hole CH3 is filled with the filler FL, and the unevenness created due to the contact hole CH3 can be significantly lessened. Therefore, in these examples, advantageous effect similar to those of the examples shown in FIGS. 16 and 17 can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate including:
        a plurality of signal lines provided along a first direction,
        an organic insulating film located on the plurality of signal lines, and
        a plurality of first spacers located on the organic insulating film along the first direction; and
    a second substrate opposing the first substrate and including a plurality of second spacers opposing the first spacers, wherein
    the organic insulating film includes a plurality of through-holes between the plurality of signal lines in plan view,
    the plurality of first spacers are provided to overlap the through-holes in the plan view and filling the through-holes,
    the plurality of second spacers are provided to overlap the through-holes and the first spacers in the plan view, and
    further comprising a plurality of fillers provided between and connected to the first spacers, and filling the through-holes.

2. The display device according to claim 1, wherein
    the first spacers include a first portion extending along the first direction and a second portion projecting from the first portion along a second direction crossing the first direction between the first signal line and the second signal line, and
    the first portion has a first length along the first direction and the second portion has a second length along the second direction, and the first length is greater than the second length.

3. The display device according to claim 2, wherein
    the first spacers include a third portion projecting to a side opposite to the second portion, and the third portion has a third length along the second direction, which is different from the second length.

4. The display device according to claim 2, wherein the first spacers include a third portion concave to a side opposite to the second portion.

5. The display device according to claim 1, wherein the first spacers include a first portion extending along the first direction and a second portion projecting from the first portion along a second direction crossing the first direction, the second spacers overlap at least the second portion in the plan view, and further comprising a third spacer that includes a fourth portion extending along the first direction, and a fifth portion projecting from the fourth portion in a direction opposite to a direction in which the second portion projects from the first portion.

6. The display device according to claim 1, wherein the plurality of fillers are formed from organic insulating material.

7. The display device according to claim 1, wherein the plurality of fillers comprise a first main body portion, a second main body portion, and a leg portion, the leg portion extends outwards from the through-holes, first main body portion and the second main body portion overlap adjacent through-holes of the plurality of through-holes.

* * * * *